United States Patent
Monro

(10) Patent No.: US 7,508,325 B2
(45) Date of Patent: Mar. 24, 2009

(54) MATCHING PURSUITS SUBBAND CODING OF DATA

(75) Inventor: Donald Martin Monro, Beckington (GB)

(73) Assignee: Intellectual Ventures Holding 35 LLC, Las Vegas, NV (US)

( * ) Notice: Subject to any disclaimer, the term of this patent is extended or adjusted under 35 U.S.C. 154(b) by 0 days.

(21) Appl. No.: 11/470,611

(22) Filed: Sep. 6, 2006

(65) Prior Publication Data
US 2008/0055120 A1   Mar. 6, 2008

(51) Int. Cl.
*H03M 7/30* (2006.01)
(52) U.S. Cl. .................... 341/50; 382/248; 375/240.11
(58) Field of Classification Search .................. 341/50; 375/240.11, 240.18, 240.19; 382/248, 253
See application file for complete search history.

(56) References Cited

U.S. PATENT DOCUMENTS

| | | | |
|---|---|---|---|
| 4,168,513 A | 9/1979 | Hains et al. | |
| 4,509,038 A | 4/1985 | Hirano | |
| 4,675,809 A | 6/1987 | Omoda | |
| 4,908,873 A | 3/1990 | Philbert et al. | |
| 5,218,435 A * | 6/1993 | Lim et al. | 375/240.16 |
| 5,315,670 A | 5/1994 | Shapiro | |
| 5,321,776 A | 6/1994 | Shapiro | |
| 5,412,741 A | 5/1995 | Shapiro | |
| 5,559,931 A | 9/1996 | Shindou et al. | |
| 5,699,121 A | 12/1997 | Zakhor et al. | |
| 5,748,786 A | 5/1998 | Zandi et al. | |
| 5,754,704 A | 5/1998 | Barnsley et al. | |
| 5,768,437 A | 6/1998 | Monro et al. | |
| 5,956,429 A | 9/1999 | Burns | |
| 6,029,167 A | 2/2000 | Evans | |
| 6,052,416 A | 4/2000 | Koga | |
| 6,078,619 A | 6/2000 | Monro et al. | |
| 6,086,706 A | 7/2000 | Brassil et al. | |
| 6,125,348 A | 9/2000 | Levine | |
| 6,144,835 A | 11/2000 | Inoue | |
| 6,208,744 B1 | 3/2001 | Ishige et al. | |
| 6,556,719 B1 | 4/2003 | Monro | |
| 6,654,503 B1 | 11/2003 | Sudharsanan et al. | |
| 6,820,079 B1 | 11/2004 | Evans | |
| 6,847,966 B1 | 1/2005 | Sommer et al. | |
| 6,990,145 B2 | 1/2006 | Monro et al. | |

(Continued)

FOREIGN PATENT DOCUMENTS

EP    0 595 599 A2    5/1994

(Continued)

OTHER PUBLICATIONS

Monro, Basis Picking for Matching Pursuits Image Coding, IEEE 2004 International Conference on Image Processing (ICIP), vol. 4, pp. 2495-2498, Oct. 2004.*

(Continued)

*Primary Examiner*—Howard Williams
(74) *Attorney, Agent, or Firm*—Sterne, Kessler, Goldstein & Fox P.L.L.C.

(57) ABSTRACT

A method, system, and computer program product are used for coding multi-dimensional data using a codebook of basis functions. A transform is applied to the multi-dimensional data to create transform coefficients. Groups of transform coefficients are formed. Different groups of transform coefficients are coded with non-identical dictionaries of basis functions from the codebook.

71 Claims, 5 Drawing Sheets

| Picked No $k$ | Width $d$ $2w_k+1$ | Frequency $f_k$ | Phase $(*\pi/4)$ | Attenuation $\sigma_k$ |
|---|---|---|---|---|
| 1 | 1 | 0 | 0 | 1 |
| 2 | 5 | 0 | 0 | 8 |
| 3 | 9 | 3 | 1.5 | 2 |
| 4 | 9 | 0 | 0 | 24 |
| 5 | 9 | 1 | 1 | 2 |
| 6 | 3 | 1 | 0 | 2 |
| 7 | 5 | 1 | 2 | 1 |
| 8 | 3 | 0 | 0 | 12 |
| 9 | 7 | 2 | 1.5 | 12 |
| 10 | 7 | 1 | 1.5 | 4 |
| 11 | 7 | 0 | 0 | 12 |
| 12 | 5 | 2 | 0 | 12 |
| 13 | 9 | 1 | 2 | 8 |
| 14 | 5 | 1 | 1 | 24 |

U.S. PATENT DOCUMENTS

| | | |
|---|---|---|
| 7,003,039 B2 | 2/2006 | Zakhor et al. |
| 7,079,986 B2 | 7/2006 | Sieracki |
| 2003/0058943 A1* | 3/2003 | Zakhor et al. .......... 375/240.12 |
| 2004/0028135 A1 | 2/2004 | Monro |
| 2004/0126018 A1 | 7/2004 | Monro |
| 2004/0165737 A1 | 8/2004 | Monro |
| 2004/0218836 A1 | 11/2004 | Kanatsu |
| 2005/0149296 A1* | 7/2005 | Sieracki ...................... 702/189 |
| 2007/0016414 A1* | 1/2007 | Mehrotra et al. ............ 704/230 |
| 2007/0030177 A1 | 2/2007 | Monro |
| 2007/0053434 A1 | 3/2007 | Monro |
| 2007/0053597 A1 | 3/2007 | Monro |
| 2007/0053603 A1 | 3/2007 | Monro |
| 2007/0164882 A1 | 7/2007 | Monro |
| 2007/0258654 A1 | 11/2007 | Monro |
| 2007/0271250 A1 | 11/2007 | Monro |
| 2007/0282933 A1 | 12/2007 | Monro |
| 2007/0290898 A1 | 12/2007 | Monro |
| 2007/0290899 A1 | 12/2007 | Monro |
| 2008/0005648 A1 | 1/2008 | Monro |
| 2008/0055120 A1 | 3/2008 | Monro |
| 2008/0056346 A1 | 3/2008 | Monro |
| 2008/0084924 A1 | 4/2008 | Monro |
| 2008/0086519 A1 | 4/2008 | Monro |

FOREIGN PATENT DOCUMENTS

| | | |
|---|---|---|
| EP | 0 836 325 A1 | 4/1998 |
| EP | 1 545 010 A1 | 6/2005 |
| GB | 2 293 733 A | 4/1996 |
| GB | 2 409 943 A | 7/2005 |
| WO | WO97/16029 | 5/1997 |
| WO | WO98/11730 | 3/1998 |
| WO | WO99/08449 | 2/1999 |
| WO | WO01/15456 | 3/2001 |
| WO | WO01/63935 | 8/2001 |
| WO | WO02/13538 | 2/2002 |
| WO | WO2004/051863 | 6/2004 |
| WO | WO2005/027049 | 3/2005 |
| WO | WO2005/119581 | 12/2005 |
| WO | WO2007/030702 | 3/2007 |
| WO | WO2007/030784 | 3/2007 |
| WO | WO2007/030785 | 3/2007 |
| WO | WO2007/030788 | 3/2007 |
| WO | WO 2007/084336 | 7/2007 |
| WO | WO 2007/118220 | 10/2007 |
| WO | WO 2007/145875 | 12/2007 |
| WO | WO 2007/149358 | 12/2007 |
| WO | WO 2007/149383 | 12/2007 |
| WO | WO 2007/149384 | 12/2007 |
| WO | WO 2008/027450 | 3/2008 |
| WO | WO 2008/030426 | 3/2008 |
| WO | WO/2008/045280 | 4/2008 |
| WO | WO/2008/045281 | 4/2008 |

OTHER PUBLICATIONS

De Vleeschouwer et al., Subband dictionaries for low-cost matching pursuits of video residues, IEEE Transactions on Circuits and Systems for Video Technology, vol. 9, Issue 7 pp. 984-993, Oct. 1999.*

Brin et al., Copy detection mechanisms for digital documents, Proceedings of the 1995 ACM SIGMOD international conference on Management of data SIGMOD '95, vol. 24 ACM Press, May 1995, pp. 398-409.

Cancedda et al., Word Sequence Kernels, Mar. 2003, MIT Press, Journal of Machine Learning Research, vol. 3 Special Edition, pp. 1059-1082.

Cover et al. "Elements of Information Theory" Copyright Jon Wiley & Sons, Inc., p. 96, 1991.

De Natale, et al., "A Mesh-Interpolation Scheme for Very-Low Bitrate Coding of Video Sequences" European Transactions on Telecommunications, vol. 9, No. 1, pp. 47-55, 1998.

Gamito et al. "Lossless Coding of Floating Point Data with JPEG 2000 Part 10" Proceedings of the SPIE, SPIE, Bellingham, VA, US. vol. 5558, Aug. 2, 2004. pp. 276-287.

Golomb, S.W., "Run-length encodings" IEEE Trans Info Theory, Jul. 1966, 12(3):399-401.

Horst et al. "Mupcos: A multi-purpose coding scheme" Signal Processing: Image Communication 5, pp. 75-89, 1993.

Hosang, M., "A Character Elimination Algorithm for Lossless Data Compression" Data Compression Conference, Proceedings. DCC, IEEE Computer Society Press, Los Alamitos, CA, US, Apr. 2, 2002, pp. 1-10.

Huffman, David A., "A Method for the Construction of Minimum-Redundancy Codes," Pro. Inst. Radio Eng., 1952, 9 (40), pp. 1098-1101.

Hull, Jonathan J., "Document Image Matching and Retrieval with Multiple Distortion-Invariant Descriptors", International Association for Pattern Recognition Workshop on Document Analysis Systems, Series in Machine Perception and Artificial Intelligence, vol. 14, published by World Scientific Publishing Co. Pte. Ltd. 1995, pp. 379-396.

Jun-peng Bao et al., "A new text feature extraction model and its application in document copy detection" Machine Learning and Cybernetics, 2003, International Conference on Nov. 2-5, 2003 Piscataway, NJ, USA, IEEE, vol. 1, Nov. 2, 2003, pp. 82-87.

Larsson, N.J., "The Context Trees of Block Sorting Compression" In Proceedings of the IEEE Data Compression Conference, Snowbird, Utah, Mar. 30-Apr. 1, pp. 189-198, IEEE Computer Society Press, 1998.

Said et al., "A New, Fast, and Efficient Image Codec Based on Set Partitioning in Heirarchical Trees" IEEE Transactions on Circuits and Systems for Video Technology, vol. 6, No. 3, pp. 243-250, Jun. 1996.

Sayood, Khalid, "Introduction to Data Compression" Morgan Kaufmann Publishers Inc., San Francisco, CA, USA 1996, pp. 27-32.

Sayood, Khalid, "Introduction to Data Compression" Morgan Kaufmann Publishers Inc., San Francisco, CA, USA 1991, pp. 98-99.

Salomon, "Data Compression: the complete reference", Springer, pp. 32-33, 1998.

Schleimer et al., Data security protection: Winnowing: local algorithms for document fingerprinting, 2003 ACM SIGMOD international conference on Management of data (SIGMOD '03), ACM Press, Jun. 2003, pp. 76-85.

Teuhola, J. "A Compression Method for Clustered Bit-Vectors" Information Processing Letters, Amsterdam, NL, vol. 7, No. 6, pp. 308-311, Oct. 1978.

Tian et al., "Image Data Processing in the Compressed Wavelet Domain" Proceedings of ICSP'96, pp. 978-981, 1996.

Trott et al. "Wavelets Applied to Lossless Compression and Progressive Transmission of Floating Point Data in 3-D Curvilinear Grids" IEEE Proceedings of the Visualization Conference, Oct. 27, 1996, pp. 385-388.

Donald Monro, U.S. Appl. No. 11/677,515, filed Feb. 21, 2007, entitled "Hierarchical Update Scheme for Extremum Location with Indirect Addressing".

Donald Monro, U.S. Appl. No. 11/678,004, filed Feb. 22, 2007, entitled, "Video Coding With Motion Vectors Determined By Decoder".

Donald Monro, U.S. Appl. No. 11/678,479, filed Feb. 23, 2007, entitled, "Video Coding With Embedded Motion".

Donald Monro, U.S. Appl. No. 11/777,256, filed Jul. 11, 2007.

Donald Monro, U.S. Appl. No. 11/677,511, filed Feb. 21, 2007, entitled "Hierarchical Update Scheme For Extremum Location".

Donald Monro, U.S. Appl. No. 11/777,239, filed Jul. 12, 2007.

Donald Monro, U.S. Appl. No. 11/777,230, filed Jul. 12, 2007.

Donald Monro, U.S. Appl. No. 11/777,130, filed Jul. 12, 2007.

Donald Monro, U.S. Appl. No. 11/777,144, filed Jul. 12, 2007.

Donald Monro, U.S. Appl. No. 11/777,122, filed Jul. 12, 2007.

Donald Monro, U.S. Appl. No. 11/777,100, filed Jul. 12, 2007.

Donald Monro, U.S. Appl. No. 11/777,081, filed Jul. 12, 2007.

Donald Monro, U.S. Appl. No. 11/777,022, filed Jul. 12, 2007.

Donald Monro, U.S. Appl. No. 11/776,786, filed Jul. 12, 2007.

Donald Monro, PCT Serial No. PCT/US2007/008861, filed Apr. 9, 2007, entitled "Motion Assisted Data Enhancement".

Donald Monro, PCT Serial No. PCT/US2008/002100, filed Feb. 19, 2008, entitled "Hierarchical Update Scheme For Extremum Location".

Donald Monro, PCT Serial No. PCT/US2008/002101, filed Feb. 19, 2008, entitled "Hierarchical Update Scheme for Extremum Location with Indirect Addressing".

International Search Report for Appln. No. PCT/US2007/013100 issued Jan. 14, 2008, 4pgs.

International Search Report for Appln. No. PCT/US2007/000759 issued Feb. 14, 2008, 7pgs.

International Search Report for Appln. No. PCT/US2007/014138 issued Oct. 29, 2007, 2 pgs.

International Search Report for Appln. No. PCT/US2007/014182 issued Jan. 18, 2008, 1 pg.

International Search Report for Appln. No. PCT/US2007/014181 issued Jan. 14, 2008.

Non-Final Office Action for U.S. Appl. No. 11/255,090, completed Feb. 2, 2008, mailed Feb. 6, 2008, 14pgs.

Non-Final Office Action for U.S. Appl. No. 11/332,777, completed Dec. 12, 2007, mailed Dec. 21, 2007, 4pgs.

Final Office Action for U.S. Appl. No. 11/425,142, completed Sep. 10, 2007, mailed Sep. 18, 2007, 9 pgs.

Non-Final Office Action for U.S. Appl. No. 11/425,142, completed Mar. 7, 2007, mailed Mar. 20, 2007, 8 pgs.

Non-Final Office Action for U.S. Appl. No. 11/470,611, completed Aug. 29, 2007, mailed Sep. 5, 2007, 6 pgs.

Written Opinion for Appln. No. PCT/US2007/000759 completed Feb. 14, 2007, mailed Feb. 25, 2008, 11pgs.

U.S. Appl. No. 11/255,090, filed Oct. 19, 2005, Monro.

Monro et al., "Bases for Low Complexity Matching Pursuits Image Coding" www.http://dmsun4.bath.ac.uk., no further information available.

Yuan et al., "Improved Matching Pursuits Image Coding" IEEE International Conference on Acoustics, Speech and Signal Processing ICASSP 2005, pp. II-201-204, Mar. 2005.

Monro, "Basis Picking for Matching Pursuits Image Coding" IEEE International Conference on Image Processing, pp. 2495-2498, Sep. 2004.

Yuan et al., "Low Complexity Separable Matching Pursuits" IEEE Int. Conference Acoustics Speech Signal Process, pp. III-725-728, May 2004.

Figueras et al., "Color Image Scalable Coding with Matching Pursuit" IEEE Int. Conference Acoustics Speech Signal Process, pp. III-53-56, May 2004.

Monro et al., "Improved Coding of Atoms in Matching Pursuits" IEEE Int. Conf. Image Process, vol. 2, Sep. 2003.

Frossard et al., "High Flexibility Scalable Image Coding" Proceedings of VCIP 2003, Jul. 2003.

Poh et al., "Comparison of Residual Compression Methods in Motion Compensated Video" IEEE Int. Workshop on Multimedia Signal Processing, pp. 109-112, Dec. 2002.

Moschetti et al., "New Dictionary and Fast Atom Searching Method for Matching Pursuit Representation of Displaced Frame Difference" IEEE International Conference on Image Processing, pp. III-685-688, Sep. 2002.

Neff et al., "Matching Pursuit Video Coding-Part I: Dictionary Approximation" IEEE Trans. Circuits System Video Technology, vol. 12, No. 1, pp. 13-26, Jan. 2002.

Tredwell et al., "A Sequential Vector Selection Algorithm for Controllable Bandwidth Motion Description Encoding" IEEE Sympos. Intell. Multimedia. Video & Speech Process, May 2001.

Czerepinski et al., "Matching Pursuits Video Coding: Dictionaries and Fast Implementation", IEEE Trans Circuit Systems Video Technology, vol. 10, No. 7, pp. 1103-1115, Oct. 2000.

Monro et al., "Visual Embedding of Wavelet Transform Coefficients" IEEE International Conference Image Process, pp. 186-189, Sep. 2000.

Neff et al., "Very Low Bit-Rate Video Coding Based on Matching Pursuits" IEEE Trans. Circuits and Systems for Video Tech., vol. 7, No. 1, pp. 158-171, Feb. 1997.

Mallat et al., "Matching Pursuits with Time-Frequency Dictionaries" IEEE Trans. Signal Processing, vol. 41, No. 12, pp. 3397-3415, Dec. 1993.

Steffen et al., "Theory of Regular $M$-band Wavelets", IEEE Transactions on Signal Processing, vol. 41, No. 12, pp. 3497-3511, Dec. 1993.

Shapiro, "Embedded Image Coding Using Zerotrees of Wavelet Coefficients", IEEE Transactions on Signal Processing, vol. 41, No. 12, pp. 3445-3462, Dec. 1993.

Ramchandran et al., "Best Wavelet Packet Bases in a Rate-Distortion Sense", IEEE Transactions on Signal Processing, vol. 2, No. 2, pp. 160-175, Apr. 1993.

Mallat, "A Theory for Multiresolution Signal Decomposition: The Wavelet Representation" IEEE Trans. Pattern Anal. Mach. Intel., vol. 11, No. 7, Jul. 1989.

Daubechies "Orthonormal Bases of Compactly Supported Wavelets" Comm. Pure Appl. Math., vol. 41, pp. 909-996, 1988.

Final Office Action for U.S. Appl. No. 11/332,777, mailed Aug. 13, 2008, 5 pgs.

Final Office Action for U.S. Appl. No. 11/255,090, mailed Sep. 3, 2008, 11 pgs.

Non-Final Office Action for U.S. Appl. No. 11/425,142, mailed Sep. 16, 2008, 12 pgs.

International Search Report for Patent Cooperation Treaty Appln. No. PCT/US2007/019034 issued Apr. 8, 2008, 2pgs.

Written Opinion for Patent Cooperation Treaty Appln. No. PCT/US2007/019034 completed Mar. 31, 2008, mailed Apr. 8, 2008, 7pgs.

Non-Final Rejection for U.S. Appl. No. 11/470,611, mailed on Jun. 30, 2008, 5 pgs.

Non-Final Rejection for U.S. Appl. No. 11/422,316, mailed on Jul. 3, 2008, 7 pgs.

Yuan et al., "Improved Matching Pursuits Image Coding," Acoustics, Speech, and Signal Processing, 2005, vol. 2, 18, pp. 201-204.

Haoxing Zhang et al., "A Hybrid Video Coder Based on H.264 with Matching Pursuits," Acoustics, Speech and Signal Processing, 2006, p. 889.

Yuan et al., "3D Wavelet Video Coding with Replicated Matching Pursuits," Sep. 11, 2005, Image Processing, pp. 69-72.

Monro et al., "Subband Adaptive Dictionaries for Wavelet/Matching Pursuits Image Coding," Oct. 8, 2006, Image Processing, p. 2136.

Rabiee et al., "Scalable Subband Image Coding with Segmented Orthogonal Matching Pursuit," Oct. 4, 1998, Image Processing, pp. 774-777.

Rabiee et al., "Low-bit-rate Subband Image Coding with Matching Pursuits," Visual Communications and Image Processing, vol. 3309, 1998, pp. 875-880.

International Search Report for Appln. No. PCT/US2007/019297, dated Dec. 12, 2008, 5 pgs.

* cited by examiner

Figure 1

The PSNR as successive bases are selected in a 14x14 separable codebook at a fixed rate of 0.4 bpp.

Figure 3:

| Picked No $k$ | Width $d$ $2w_k+1$ | Frequency $f_k$ | Phase $(*\pi/4)$ | Attenuation $\sigma_k$ |
|---|---|---|---|---|
| 1 | 1 | 0 | 0 | 1 |
| 2 | 5 | 0 | 0 | 8 |
| 3 | 9 | 3 | 1.5 | 2 |
| 4 | 9 | 0 | 0 | 24 |
| 5 | 9 | 1 | 1 | 2 |
| 6 | 3 | 1 | 0 | 2 |
| 7 | 5 | 1 | 2 | 1 |
| 8 | 3 | 0 | 0 | 12 |
| 9 | 7 | 2 | 1.5 | 12 |
| 10 | 7 | 1 | 1.5 | 4 |
| 11 | 7 | 0 | 0 | 12 |
| 12 | 5 | 2 | 0 | 12 |
| 13 | 9 | 1 | 2 | 8 |
| 14 | 5 | 1 | 1 | 24 |

Figure 4 :

| Picked No k | LL Basis | HL Basis | LH Basis | HH Basis |
|---|---|---|---|---|
| 1 | 1,1 | 1,1 | 1,1 | 1,1 |
| 2 | 4,11 | 1,11 | 2,1 | 4,2 |
| 3 | 1,7 | 1,8 | 5,6 | 11,4 |
| 4 | 3,1 | 6,3 | 7,1 | 1,5 |
| 5 | 8,1 | 1,6 | 6,1 | 3,1 |
| 6 | 9,2 | 5,14 | 10,5 | 1,3 |
| 7 | 3,3 | 6,1 | 7,6 | 6,3 |
| 8 | 9,3 | 1,13 | 2,7 | 8,3 |
| 9 | 2,2 | 14,6 | 8,7 | 3,6 |
| 10 | 6,9 | 1,4 | 7,8 | 3,8 |
| 11 | 10,5 | 3,8 | 4,1 | 12,1 |
| 12 | 1,8 | 6,14 | 6,6 | 14,6 |
| 13 | 5,5 | 6,11 | 9,1 | 1,14 |
| 14 | 9,11 | 8,3 | 10,9 | 5,6 |
| 15 | 1,6 | 6,6 | 1,5 | 9,1 |
| 16 | 14,10 | 1,10 | 6,3 | 13,12 |
| 17 | 4,1 | 1,5 | 7,13 | 10,1 |
| 18 | 6,2 | 1,9 | 13,6 | 11,9 |
| 19 | 6,7 | 6,5 | 14,6 | 9,6 |
| 20 | 14,6 | 14,7 | 1,8 | 5,8 |
| 21 | 10.7 | 8,8 | 9,14 | 12,11 |
| 22 | 3,7 | 12,7 | 6,12 | 7,5 |
| 23 | 6,14 | 6,4 | 6,7 | 7,12 |
| 24 | 12,5 | 12,6 | 4,6 | 10,6 |
| 25 | 13,1 | 1,12 | 7,3 | 10,14 |
| 26 | 14,12 | 6,9 | 8,14 | 6,1 |
| 27 | 4,3 | 6,10 | 3,13 | 1,7 |
| 28 | 12,7 | 1,14 | 3,1 | 6,12 |
| 29 | 7,7 | 14,14 | 6,2 | 4,6 |
| 30 | 1,4 | 10,1 | 10,2 | 1,2 |
| 31 | 13,2 | 2,13 | 13,7 | 5,9 |
| 32 | 12,4 | 7,14 | 3,12 | 2,11 |
| 33 | 6,3 | 13,14 | 11,13 | 9,3 |
| 34 | 12,3 | 4,14 | 2,12 | 6,7 |
| 35 | 11,6 | 11,14 | 5,11 | 13,1 |
| 36 | 12,6 | 6,7 | 8,1 | 5,2 |
| 37 | 4,6 | 2,9 | 9,5 | 11,1 |
| 38 | 12,1 | 7,10 | 13,1 | 4,4 |
| 39 | 11,1 | 11,3 | 5,2 | 6,9 |
| 40 | 10,9 | 10,14 | 5,1 | 12,8 |
| 41 | 5,14 | 6,12 | 5,3 | 5,14 |
| 42 | 11,3 | 7,11 | 7,2 | 13,13 |
| 43 | - | 14,5 | 10,4 | 8,7 |
| 44 | - | 9,7 | - | - |
| 45 | - | 3,7 | - | - |
| 46 | - | 11,5 | - | - |

MATCHING PURSUITS SUBBAND CODING OF DATA

FIELD

This application pertains to the field of coding data, and more particularly, to the field of selection of bases for coding data using transforms and/or matching pursuits.

BACKGROUND

Digital data for various forms of content, such as, without limitation, digital images, digital video, and/or audio information, is delivered today via wireless transmission networks, digital satellite services, streaming video and/or audio over the Internet and more. For example, again, without limitation, delivering video and/or audio content in a digital data form to personal digital assistants, cellular phones and/or other devices is continuing to increase in popularity. Therefore, a need continues for data compression and decompression techniques to allow efficient transmission and storage of digital data, regardless of the content the data represents.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description if read with the accompanying drawings in which:

FIG. 1 is a schematic diagram illustrating an embodiment of a Discrete Wavelet Transform (DWT);

FIGS. 3 and 4 are tables of example bases provided for illustration purposes.

DETAILED DESCRIPTION

Figure 2:
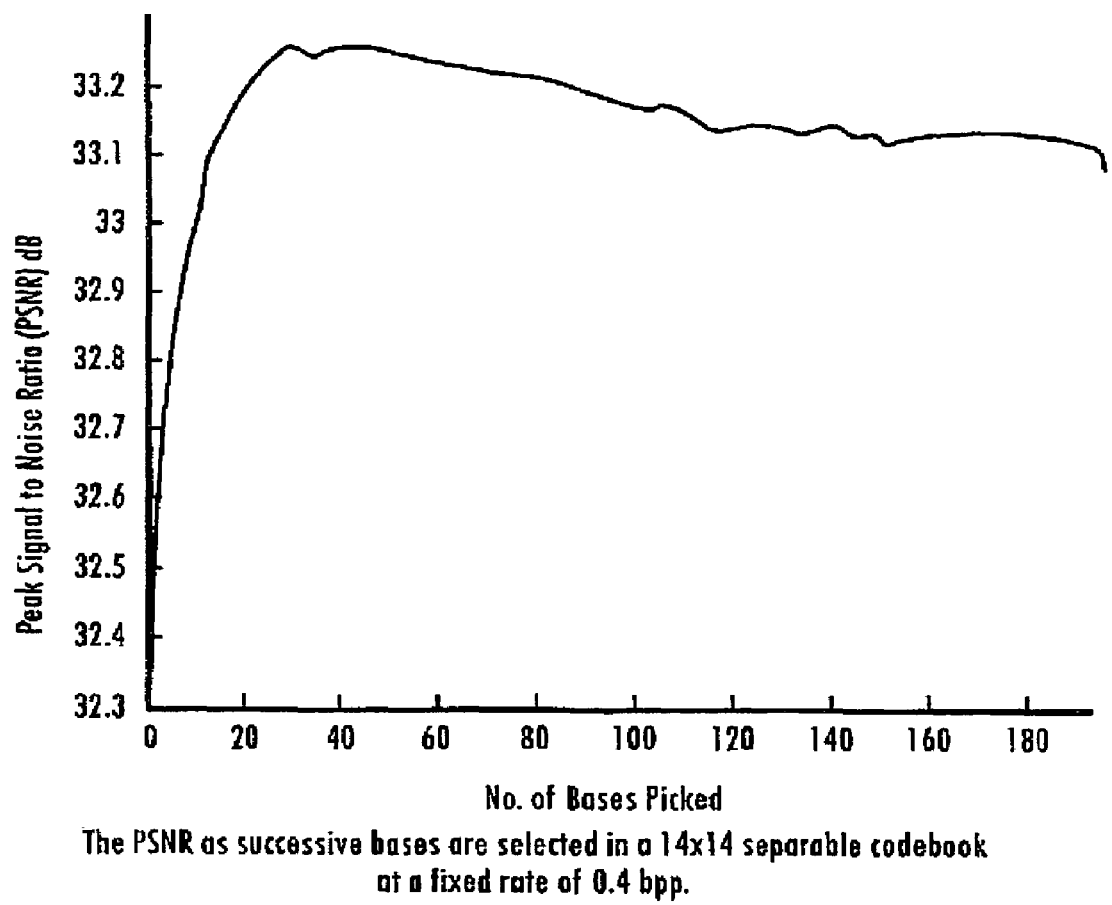
FIG. 2 is a plot illustrating basis picking results for a particular data rate.

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

Some portions of the detailed description which follow are presented in terms of algorithms and/or symbolic representations of operations on data bits and/or binary digital signals stored within a computing system, such as within a computer and/or computing system memory. These algorithmic descriptions and/or representations are the techniques used by those of ordinary skill in the data processing arts to convey the substance of their work to others skilled in the art. An algorithm is here, and generally, considered to be a self-consistent sequence of operations and/or similar processing leading to a desired result. The operations and/or processing may involve physical manipulations of physical quantities. Typically, although not necessarily, these quantities may take the form of electrical and/or magnetic signals capable of being stored, transferred, combined, compared and/or otherwise manipulated. It has proven convenient, at times, principally for reasons of common usage, to refer to these signals as bits, data, values, elements, symbols, characters, terms, numbers, numerals and/or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing", "computing", "calculating", "determining" and/or the like refer to the actions and/or processes of a computing platform, such as a computer or a similar electronic computing device, that manipulates and/or transforms data represented as physical electronic and/or magnetic quantities and/or other physical quantities within the computing platform's processors, memories, registers, and/or other information storage, transmission, and/or display devices.

Matching pursuits processes may be used to compress one dimensional or multi-dimensional data, including but not limited to: still images, audio, video, and/or digital images. A matching pursuits process may include finding a full inner product between a signal to be coded and members of a dictionary of basis functions. At a position of an inner product, a dictionary entry giving an inner product may describe the signal locally. This may be the maximum inner product over all or part of the signal. This may be referred to as an "Atom." Amplitude may be quantized, and position, quantized amplitude, sign, and dictionary number may be combined to form a code describing a particular Atom, for example. For one embodiment, quantization may be performed using a precision limited quantization method. Other embodiments may use other quantization techniques. Claimed subject matter is not limited in scope to any particular quantization method or technique. All potential quantization methods now known or to be developed are intended to be included.

In one particular embodiment, an Atom is subtracted from a signal giving a residual. The signal may be completely and/or partially described by the Atom plus the residual. The process may be repeated with new Atoms successively found and subtracted from the residual. At any stage, the signal may be completely described by the codes of the Atoms found and the remaining residual.

Matching pursuits (MP), therefore, may decompose any signal f into a linear expansion of waveforms that may belong to a redundant dictionary $D=\phi\{\gamma\}$ of basis functions, such that $$f = \sum_{n=0}^{m-1} a_n \varphi_{\gamma_n} + R^m f$$

where $R^m f$ is the $m^{th}$ order residual vector after approximating f by m 'Atoms' and $$a_n = \langle \phi_{\gamma_n}, R^n f \rangle$$

is an inner product at stage n of a dictionary with an $n^{th}$ order residual, for this particular embodiment.

For some embodiments, a dictionary of basis functions may comprise two-dimensional bases. Other embodiments may use dictionaries comprising one-dimensional bases which may be applied separably to form two-dimensional bases. To do this, a selected basis function may be applied to a set of data in one of its dimensions and another basis function may subsequently be applied in another dimension, the remaining dimension if there are two dimensions. A dictionary of b basis functions in one dimension may provide $b^2$ combinations which form a dictionary of $b^2$ basis functions in two dimensions, for example. This may likewise be extended to any number of dimensions. Therefore, in this context, the term "separably" includes applying different basis functions to data separately.

As described in more detail hereinafter, a method is described which may reduce complexity of a codebook to be applied to coding of multi-dimensional data. Likewise, improved representation of the data may also at times occur. In this particular embodiment, a dictionary of n dimensional bases may be formed separably, as described above, for example, from a set of previously determined 1D bases, although, of course, claimed subject matter is not limited in scope in this respect. A subset of a full n dimensional dictionary may be selected for coding data. In one particular embodiment, although claimed subject matter is not limited in scope in this respect, this may be implemented using a mask to select a subset of a full dictionary. For images, as one example, for a range of numbers of selected bases for a bit rate, a PSNR may, at times, provide improved results in comparison with a full 2D codebook. As described in more detail hereinafter, results with sparse dictionaries, therefore, may have lower computational cost while maintaining data integrity to a high degree.

As is known, a dictionary may play a role in terms of speed for a particular method or process of compression. See, for example, Monro, D. M., "Basis Picking for Matching Pursuits Image Coding", IEEE International Conference on Image Processing (ICIP 2004), Singapore, September 2004; Yuan Yuan and Monro., D. M., "Improved Matching Pursuits Image Coding", IEEE International Conference on Acoustics, Speech and Signal Processing ICASSP 2005, Philadelphia, March 2005. However, a dictionary may also play a role in complexity and accuracy, as explained in more detail hereinafter.

For example, if the number of 1D bases is b and the basis width or 'footprint' is $d=(2w_k+1)$, then in 2D there are $b^2$ bases. One aspect of a MP process includes repairing or updating inner products in a region of an Atom that has been removed from the data. This may involve calculation of inner products in a $dxd=d^2$ region of the image. Even if done separably, one may compute inner products in a first dimension with bases in a 1D region of extent 2d-1 for b bases of width d, at a computational cost of order $bd^2$ followed by inner products in a second dimension in a 2D region of extent 2d-1 by 2d-1 for b results of the first stage, using b bases of width d, at a computational cost of order $b^2d^3$. In this example, therefore, the second stage is more complex. In higher dimensions, the gain has the potential to be greater since complexity in n dimensions may be proportional to $b^N d^{N+1}$.

In general, a large codebook may give a greater accuracy for a particular number of Atoms selected; however, it may also employ more bits to code an Atom from a larger codebook. Therefore, at a selected bit rate, for example, it may not give the greatest accuracy. As is well-known, reducing the codebook size by half may reduce the bit cost of coding an Atom by 1 bit in the case where all bases are equally likely. More particularly, the cost of coding any of N equally probable symbols is well-known to be $\log_2 N$. Although typically probabilities of occurrence of the bases will, in general, not be equal, a similar effect may occur if the probabilities do not vary widely. Thus, a reduction in the cost of coding may occur as dictionary size is reduced. By trimming an n dimensional codebook, one may accomplish a beneficial rate/distortion trade-off, e.g., a lower distortion at a given rate or a lower bit rate for a given distortion.

In one particular embodiment, a reduced dictionary may be implemented as a mask applied to a full n dimensional dictionary by indicating which bases are to be applied. By referring to this mask, bases from a separable codebook may be selected to perform inner product calculations in a Matching Pursuits (MP) process, or applied to the data in other coding applications. For such an embodiment, while all bases may in some embodiments be considered in a first stage operation of separable computation, not all combinations are used in the second dimension, and fewer still are used in higher dimensions, potentially reducing the number of calculations. This complexity reduction has the potential to make computations feasible, especially for higher dimensional coding tasks that previously may not have been feasible. Likewise, in other embodiments, less than all bases may be considered as well in a first operation, for example. These embodiments are merely intended as illustrative examples; however, many other embodiments are intended and contemplated to be including within the scope of claimed subject matter.

A resulting dictionary may be used on a signal, or data that has been transformed, such as by a wavelet transform. Furthermore, a final dictionary may be utilized to code data with an MP process. This process may also be used with other data, including audio, visual, video, multi-dimensional, and/or non-transformed data. Furthermore, a resulting dictionary may be used to code many different types of transformed and/or non-transformed data. Yet further, an embodiment of a method and/or system, for example, within the scope of claimed subject matter, may be utilized to determine resulting dictionaries and/or codebooks for many different types of data coding.

For compression, for example, an MP process may be terminated at some stage and codes for a number of Atoms may stored and/or transmitted by a further coding process. For one embodiment, the further coding process may be a lossless coding process, although claimed subject matter is not limited in scope in this respect. Other embodiments may use other coding techniques, including non-lossless coding techniques, for example.

For example, in one embodiment, an image may be represented as a two-dimensional array of coefficients. A coefficient may represent an intensity levels at a point in such an embodiment, for example. Many images have smooth intensity variations, with the fine details being represented as sharp edges in between the smooth variations. The smooth variations in intensity may be interpreted, therefore, as low frequency components and the sharp variations as high frequency components. Low frequency components (e.g., smooth variations) may comprise gross information for an image, and high frequency components may include information to add detail to the gross information.

Figure 1:
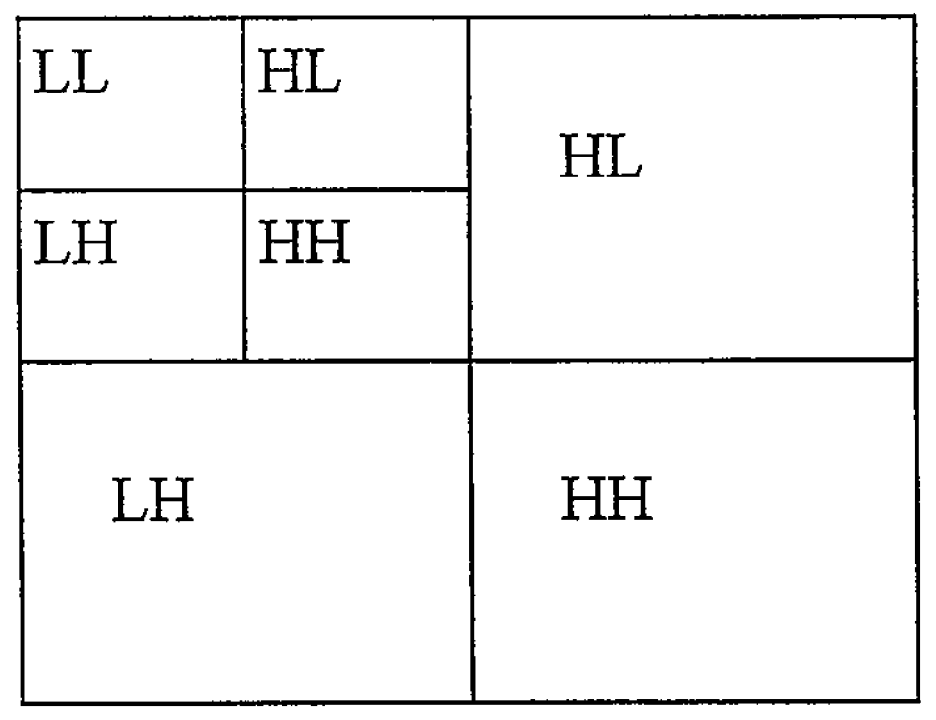

One technique for separating low frequency components from high frequency components may include a Discrete Wavelet Transform (DWT), although this is merely provided as one example and claimed subject matter is not limited in scope to this particular embodiment. Wavelet transforms may be used to decompose images, as well as other transforms, such as, to provide another example, a displaced frame difference transform, which produces a displaced frame difference image. Again, these are merely examples and claimed subject matter is not limited in scope to these examples. Nonetheless, continuing this discussion, wavelet decomposition may include the application of Finite Impulse Response (FIR) filters to separate image data into sub-sampled frequency bands. The application of the FIR filters may occur in an iterative fashion, for example, as described below in connection with FIG. 1. However, again, this is merely an example embodiment and many other approaches are possible and are intended to be included within the scope of claimed subject matter.

An additional aspect of this particular embodiment, although claimed subject matter is not limited in scope in this respect, is that many methods of coding data involve performing a frequency separating or other transform prior to coding. Transform coding may at times be desirable to apply since after transformation desired information in the data may become concentrated into coefficients that are produced or a subset of those coefficients. One example, again, without limited the scope of claimed subject matter includes the Wavelet Transform, in which an image transformation takes place that reorganizes data into frequency bands, whereby the information in the data becomes concentrated into regions of the transform coefficients according to particular characteristics of the data being transformed. Other transforms may, again, be used. This is merely one convenient example. For example, for Fourier transforms or a Discrete Cosine Transform, often applied to blocks of an image, a coefficient may be associated with a particular range of frequencies. We note that these transforms are themselves associated with specific basis dictionaries. For example, basis dictionaries of a Fourier Transform comprise full-period sine and cosine waveforms and basis dictionaries of a Discrete Cosine Transform comprise full and half period cosines waveforms.

Therefore, continuing with this particular embodiment, regardless of the transform used, once collected into blocks or bands having similar frequency characteristics, it may readily be seen that particular types of information collect into particular regions. One aspect of this particular embodiment, as described in more detail below, performance or results may be improved by employing different codebooks for different regions, such as of a transformed image, for example.

Taking the wavelet transform as an example for this discussion, bands designated HH and LL have no particular orientation of data, and so their most effective types of basis functions may be expected not to have a bias towards horizontal or vertical orientation. This is borne out in practice. However, the LL band is the result of repeated low pass filtering and so is expected to be relatively smooth. A dictionary of low frequency (smooth) bases is therefore also expected to be useful in the LL band. By contrast, the HH band has been high pass filtered in both directions. For this band, of course, information is expected to be localised and spiky, e.g., high frequency. We would, thus, expect HH bands to be represented by relatively high frequency information.

In wavelet decomposition, an image is repeatedly filtered and decimated into high and low spatial frequency bands, alternating between horizontal and vertical directions. The LL band, for example, is the result of low-pass filtering in both directions, HL is high-pass followed by low-pass, and so on. FIG. 1 is a schematic diagram illustrating an embodiment of a DWT and shows labelling assuming horizontal filtering is done first. in LL and HH sub-bands, there is not an "inherently" preferred spatial orientation of coefficients. However, in HL and LH bands or regions, data is noticeably organized into vertical and horizontal detail respectively. This suggests that different 2D codebooks may be appropriate for different categories of sub-bands or for different regions.

The bands designated HL and LH have been high pass filtered in one direction and low pass filtered in the other. A feature of these bands is that the information displays an orientation in the direction that low pass filtering has been applied. It might therefore be expected that the bases in these bands are very different, expressing the preferred direction of orientation in their composition. It also might be expected that a suitable basis dictionary for the LH band turns out to be suitable for the HL band if it is transposed so that the vertical component of an HL basis becomes the horizontal component of an LH basis, and vice versa. Experimentally, this again turns out to be the case.

As an example, the table shown in FIG. 3 provides a set of experimentally determined 1D bases from which 2D dictionaries may be formed for image coding. See D. M. Monro and Yuan Yuan, "Bases for low complexity matching pursuits image coding", IEEE Int. Conf. Image Process., September 2005.

The table in FIG. 3 lists the bases found in the aforementioned article, "Bases for low complexity matching pursuits image coding," with width d=9. The first 8 bases were recommended for coding residual images and the 14 bases for still images. Likewise, after experimentation, it has been found that combinations of bases listed in the table shown in FIG. 4 form a suitable set for image compression by Matching Pursuits if applied to different classes of sub-bands or regions after wavelet decomposition. The table shown in FIG. 4 is derived from "Subband adaptive dictionaries for Wavelet/Matching Pursuits Image Coding," by D. M. Monro, Wei Huo and Xiaopeng Wange, to be presented at the IEEE International Conference in Image Processing (ICIP 2006) on 10 Oct. 2006 in Atlanta, Ga. Likewise, expected characteristics, such as those described above, are demonstrated by this data.

In HL and LH codebooks, 15 of 46 bases appear as transposes, compared to 3.8 (e.g., 4) that would be expected by simple probability. This suggests a potential simplification whereby the HL and LH codebooks are the transpose of one another for some embodiments. Also, 7 of the 42 bases in HH are symmetrical compared with 3 that would be expected, which suggests another simplification for some embodiments. These simplifications may reduce the storage employed for dictionaries and may assist in coding of dictionary entries.

In one possible embodiment, therefore, a reduced, band adaptive dictionary may be implemented as a set of masks corresponding to the different categories of coefficients, applied in coding the corresponding regions of the transform coefficients. By referring to the appropriate mask, in some embodiment, for example, a coder may determine which separable bases to be used to perform inner product calculations in a matching pursuits process, or applied to the data in other coding applications. This may imply, for some embodiments, that selected bases may be used in the first stage operation of separable computation with different bands of coefficients, fewer combinations may be used in the second dimension, and fewer still may be used in higher dimensions, potentially reducing the number of calculations. Of course, this is merely one example embodiment and claimed subject matter is not limited in scope in this respect.

As may now be appreciated from, the prior description, not every basis is necessarily effective for image coding in a separable basis dictionary for Matching Pursuits (MP), so that a subset of bases may, in some instances, provide improved PSNR while also reducing computational complexity. To provide further background, MP was introduced by Mallat and Zhang for digital audio. See, for example, S. G. Mallat and Z. Zhang, "Matching pursuits with time frequency dictionaries", IEEE Trans. Signal Processing, vol. 41, pp. 3397-3415, December 1993. Later, Neff and Zakhor applied MP to achieve improved low bit rate video coding for motion compensated residual images within an H.263 video codec. See R. Neff and A. Zakhor "Very low bit rate video coding based on matching pursuits", IEEE Trans. Circuits Syst. Video Techol., vol. 7, pp. 158-171, February 1997. Likewise, in, for example, Y. Yuan and D. M. Monro, "Improved Matching Pursuits image Coding", Proc. IEEE Int. Conf. Acoustics, Speech, Signal Process., Philadelphia, March 2005, gains in fidelity accompanied by reductions in complexity were achieved in MP for coding both still images and motion compensated residuals. These advances came from various approaches, such as pre-transformation by wavelet, an embedded coding scheme for MP, and improved dictionaries found by 'basis picking,' see, D. M. Monro, "Basis Picking for Matching Pursuits Image Coding", IEEE Int. Conf. Image Process. Singapore, October 2004.

For this particular embodiment, to illustrate, a hybrid wavelet/MP codec is employed, although claimed subject matter is not limited in scope in this respect. Again, this is merely provided as an illustrative example. For coding, a multi-scale wavelet decomposition, for example, may be applied using the well-known bi-orthogonal 9/7 filter bank before MP approximation, although, of course, claimed subject matter is not limited in scope in this respect: It has been shown, for example, that 2 scales for CIF (352×288) residuals and 5 scales for D1 (704×576) still images are a good choice, although, again, this is merely an illustrative example and is not intended to limit the scope of claimed subject matter.

Atoms for MP may be found directly on a 2D wavelet coefficient array using a dictionary of 2D bases. In MP coding, a dictionary of basis functions is typically repeatedly searched for an inner product of largest magnitude within a data set. In 2D, however, it is usual to take a dictionary as a set of 1D bases applied separably, as described above, for example. The bases for this particular embodiment comprise an over-complete, non-orthogonal set of Gabor functions, defined by $$g_k \left( \exp\left( \frac{-\pi t^2}{\sigma_k} \right) \right)^{0.25} \cos\left( \frac{\pi f_k t}{w_k} + \phi_k \right)$$

where the dictionary index is k and $t \in [-w_k, \ldots, w_k]$.

Maximum width ('footprint') $(2w_k+1) \in [3, 5, 7, 9, \ldots]$

Basis frequencies $f_k \in [0, 1, \ldots, w_k]$

Phase shifts $\phi_k \in [0, 0.5, 1.0, 1.5, 2)\pi/4]$

Attenuation factors $\sigma_k \in [1, 2, 4, 8, 12, 16, 20, 24]$

For this particular embodiment, a subset of a full 2D dictionary may be formed. This may be done for this particular embodiment by introducing a mask into the coding process containing a zero value corresponding to a basis that is not used. Beginning with a completely zero mask, for example, a basis may be used in turn to code a training set on its own. The basis giving the highest PSNR at a desired bit rate, for example, may be selected as a first unmasked dictionary entry. With a first basis determined, a test set may be coded with combinations of this first basis with one other basis, and the highest in terms of a defined performance measure, for example, may then be added to the dictionary to become the second unmasked entry for further runs, etc. The process may be repeated until the mask is fully populated. The result is a pruned sparse 2D dictionary of every size from 1 to the maximum. This process is similar to the basis picking method for selecting 1D bases, discussed in D. M. Monro, "Basis Picking for Matching Pursuits Image Coding", IEEE Int. Conf. Image Process, Singapore, October 2004, although, of course, claimed subject matter is not limited in scope in this respect.

Successive basis masking, of course, may be a computationally intensive process. However, in some embodiments, it may be used to design a masked dictionary and, therefore, may be used in many applications after computation, although claimed subject matter is not limited in scope in this respect. Likewise, for this particular embodiment, four codebooks are sought rather than one. Thus, four masks are used here to select different bases. In this particular embodiment, then a method of coding includes taking into account which sub-band an Atom may occupy, although claimed subject matter is not limited in scope in this respect. In this example, a basis was coded by its "picking order" in the particular sub-band's mask, as in the table shown in FIG. 4. Both coder and decoder, therefore, may refer to a basis by working out which band the center of an atom lay in, from its position. Of course, again this is merely an illustrative embodiment and is not intended to limit the scope of claimed subject matter.

With a 14×14 dictionary used for coding still images, for example, selecting a first basis for the table shown in FIG. 4 was done by experience, as the Dirac or delta function is known to be an effective basis. Finding a second basis involves 4×194 runs and so on, so that the total number of runs was 76440 in this particular example. The result here is a set of four lists of effective 2D separable bases from the 196 possible combinations. These may be implemented by using 2D masks in an MP coder and decoder. The approach for this embodiment is similar to selecting 1D bases in the previously cited article, "Basis Picking for Matching Pursuits Image Coding," although, again this is merely an illustrative embodiment and is not intended to limit the scope of claimed subject matter. The previously described embodiment, therefore, is adapted for this embodiment so that, as one mask is being determined, the other three masks are held constant. A trial LL basis giving a peak PSNR at a desired bit rate is ultimately determined. Using this LL mask so found, a similar process may be applied to select a second basis for the HL band, and then with the LH and HH bands. This is repeated to add a third basis for the masks, and can be further repeated until the masks are populated to a desired extent.

A typical result is given in FIG. 4, in which mask coordinates of separable bases are made up from bases specified in FIG. 3. For still images, the Gold Hill Illuminance (Y) 704×576 image was used as a training set. For this training image, FIG. 2 shows PSNR as 2D bases are selected at 0.4 bpp. For this example, 32 bases appear to provide a peak value.

In this particular embodiment, the picking process was arranged so that one basis was added to a mask in turn. However, once this process produced masks with peak results, another process was applied. Starting with identical codebook sizes, the number of bases was varied for the masks between one basis and a maximum of 40 and peak PSNR was recalculated. This was repeated in the, cycle LL-HL-LH-HH until sizes ceased to change.

These examples show that subsets of a 2D separable Matching Pursuits Codebook applied to different wavelet sub-bands given low numbers of bases and reduce complexity, although claimed subject matter is not limited to the specifics of these trail examples. Not surprisingly, masks found at low bit rates work better at low bit rates and those found at high bit rates work better at high bit rates. A masked codebook may in some instances, at least, be found which may provide improved overall PSNR performance.

Of course, as may be appreciated, a dictionary may be described implicitly or explicitly. For example, a functional form or a curve or surface may be specified. Thus, supplying parameters rather than pre-computed basis functions may be employed. A dictionary entry, for example, may be communicated as sampled values of a function. Likewise, a dictionary entry may be communicated as parameters from which a function is capable of being computed. Of course, these are merely examples and claimed subject matter is not limited in scope in this respect.

Likewise, in other alternate embodiments, multiple dimensions, such as three spatial dimensions may be employed. In one such example, a 3D MRI Scan, or a 3D map of the temperature of the ocean or of the atmosphere or of any data or measurement describing a volume may be compressed. Likewise, alternately, a third dimension might be time. Likewise, an embodiment may employ four dimensions, such as, for example, a 3D spatial image and time. More than four dimensions may also be possible as, for example, if there is a relationship between temperature and density plus three spatial dimensions plus time. These are merely illustrative examples and many other embodiments of multiple dimensions are included within the scope of claimed subject matter. Likewise, in some embodiments, data may comprise multiple dimensions even if they might or might not be formed separable from lower dimensional bases. In this case a subset of all the possible bases might be used and a multiple dimension mask might be used to indicate which bases are used.

Figure 5:
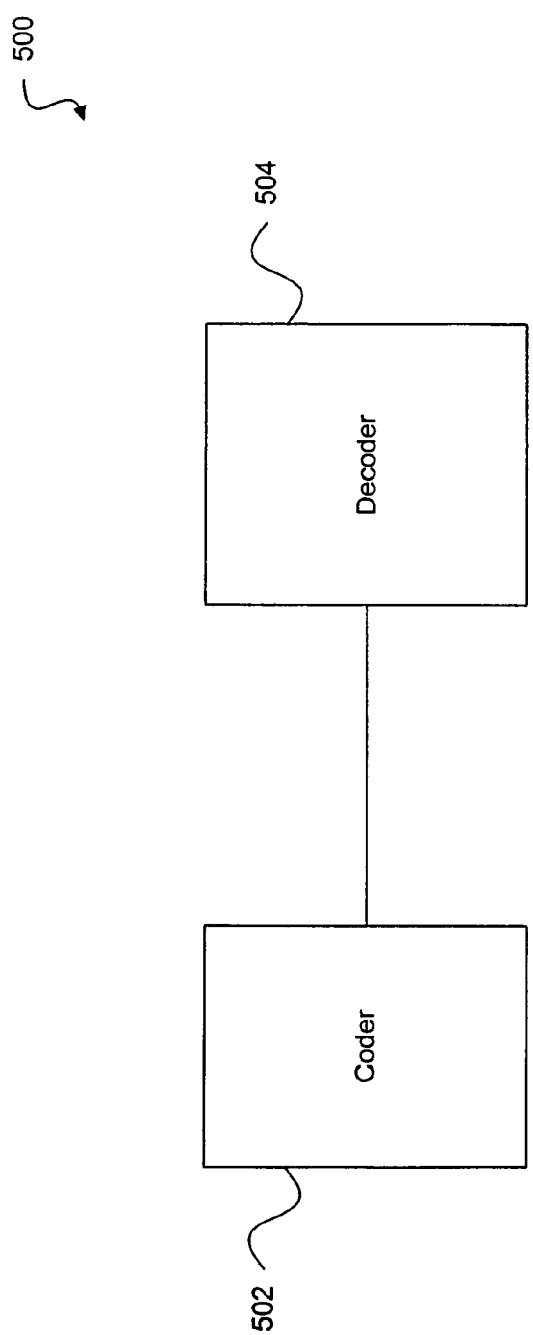
FIG. 5 illustrates an exemplary combination of devices.

It will, of course, be understood that, although particular embodiments have just been described, the claimed subject matter is not limited in scope to a particular embodiment or implementation. For example, one embodiment may be in hardware, such as implemented to operate on a device or combination of devices, such as a combination of devices 500 including a coder 502 and a decoder 504 as illustrated in FIG. 5, for example, whereas another embodiment may be in software. Likewise, an embodiment may be implemented in firmware, or as any combination of hardware, software, and/or firmware, for example. Likewise, although claimed subject matter is not limited in scope in this respect, one embodiment may comprise one or more articles, such as a storage medium or storage media. This storage media, such as, one or more CD-ROMs and/or disks, for example, may have stored thereon instructions, that when executed by a system, such as a computer system, computing platform, or other system, for example, may result in an embodiment of a method in accordance with claimed subject matter being executed, such as one of the embodiments previously described, for example. As one potential example, a computing platform may include one or more processing units or processors, one or more input/output devices, such as a display, a keyboard and/or a mouse, and/or one or more memories, such as static random access memory, dynamic random access memory, flash memory, and/or a hard drive.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well known features were omitted and/or simplified so as not to obscure the claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

In an exemplary embodiment, there is a method for coding multi-dimensional data using a codebook of basis functions. The coding includes a step of applying a transform to the data. The coding also includes a step of coding different groupings of transform coefficients with non-identical dictionaries of basis functions. Optionally, the non-identical basis dictionaries may include subsets of a master basis dictionary. Further, the non-identical basis dictionaries may have non-overlapping subsets of a master basis dictionary. The non-identical basis dictionaries may have overlapping subsets of a master basis dictionary. Data indicative of the subsets may initially be known to a decoder. In an exemplary embodiment, a subset dictionary entry may be communicated as parameters from which a function is capable of being computed. Additionally, a subset dictionary entry may be communicated as sampled values of a function. Data indicative of the subsets to be used may be communicated to a decoder. Further, the subsets may be described by a mask that is applied to the master dictionary. In another embodiment, the data and the dictionaries are two dimensional. The two dimensional data may include a digital image. Optionally, the data and the dictionaries may be three dimensional. Two of the dimensions may be spatial and the third dimension may be temporal. The three data dimensions may be spatial. The data and the active dictionaries may be of higher than three dimensions. At least one of the dimensions may be temporal.

In an example, the data dimension is higher than the codebook dimension and the coding may include a Matching Pursuits coding process applied to lower dimensions of the data. A transform may be applied to at least one dimension of the data prior to application of a Matching Pursuits process. The transform may have a wavelet transform. The coefficient groupings may have sub-bands of the wavelet transform. The wavelet transform may have a multi-dimensional wavelet transform. The multi-dimensional wavelet transform may include a Discrete Cosine Transform and the coefficient groupings may have coefficients collected into bands. Basis functions applied to at least one particular coefficient grouping may have the n dimensional transpose of basis functions applied to at least one other coefficient grouping.

In an exemplary embodiment, there is a method that decodes multi-dimensional data using a codebook of basis functions. The decoding includes a step of decoding different groupings of transform coefficients with non-identical dictionaries of basis functions. The decoding also includes a step of applying a transform to the decoded data. Optionally, the non-identical basis dictionaries have subsets of a master basis dictionary. Further, a subset dictionary entry may be communicated as sampled values of a function. A subset dictionary entry may be communicated as parameters from which a function is capable of being computed. Data indicative of the subsets to be used may be communicated to a coder. Subsets may be described by a mask that is applied to a master dictionary. Additionally, the data and the dictionaries may be two dimensional. The two dimensional data may include a digital image. Further, the data and the dictionaries may be three dimensional. Two of the three dimensions may be spatial and the third dimension may be temporal. In addition, the three dimensions may be spatial. Optionally, the data and the dictionaries may be of more than three dimensions. One of the dimensions may be temporal. In an exemplary embodiment, the data dimension is higher than the codebook dimension and a Matching Pursuits process may be applied to lower dimensions of the data. Further, the transform may have an inverse wavelet transform. The transform may have an inverse Discrete Cosine Transform.

In an exemplary embodiment, there is an article having a storage medium having stored therein instructions that, if executed, result in decoding multi-dimensional data using a codebook of basis functions. The decoding includes a step of decoding different groupings of transform coefficients with non-identical dictionaries of basis functions. The decoding also includes a step of applying a transform to the decoded data. Optionally, the instructions, if executed, further result in the non-identical basis dictionaries having subsets of a master basis dictionary. The instructions, if executed, may further result in the non-identical basis dictionaries having overlapping subsets of a master basis dictionary. The instructions, if executed, may further result in a dictionary entry being communicated as parameters from which a function is capable of being computed. Also, the instructions, if executed, may further result in a dictionary entry being communicated as sampled values of a function.

In an exemplary embodiment, there is an article having a storage medium having stored therein instructions that, if executed, result in coding multi-dimensional data using a codebook of basis functions. The coding includes a step of applying a transform to the data. The coding also includes a step of coding different groupings of transform coefficients with non-identical dictionaries of basis functions. Optionally, the instructions, if executed, further result in the non-identical basis dictionaries having subsets of a master basis dictionary. The instructions, if executed, may further result in the non-identical basis dictionaries having overlapping subsets of a master basis dictionary. The instructions, if executed, may further result in a subset dictionary entry being communicated as parameters from which a function is capable of being computed. Also, the instructions, if executed, may further result in a subset dictionary entry being communicated as sampled values of a function. Additionally, the instructions, if executed, may further result in data indicative of the subsets to be used being communicated to a decoder.

The invention claimed is:

1. A method for coding multi-dimensional data using a codebook of basis functions, comprising:
   (a) applying a transform to the multi-dimensional data to create transform coefficients, wherein the multi-dimensional data has a total number of dimensions greater than a total number of dimensions of the codebook of basis functions;
   (b) forming groups of the transform coefficients; and
   (c) coding different ones of the groups of the transform coefficients using matching pursuits coding with non-identical dictionaries of basis functions from the codebook of basis functions.

2. The method of claim 1, wherein step (c) comprises using subsets of a master basis dictionary in the non-identical dictionaries of basis functions.

3. The method of claim 2, wherein step (c) comprises using non-overlapping subsets of the master basis dictionary in the non-identical dictionaries of basis functions.

4. The method of claim 2, wherein step (c) comprises using overlapping subsets of the master basis dictionary in the non-identical dictionaries of basis functions.

5. The method of claim 2, wherein step (c) comprises using data indicative of the subsets of the master basis dictionary.

6. The method of claim 2, further comprising:
   (d) communicating the subsets with a decoder.

7. The method of claim 2, further comprising:
   (d) communicating the subsets in a form of a sampled value of a function with a decoder.

8. The method of claim 2, further comprising:
   (d) communicating data indicative of the subsets with a decoder.

9. The method of claim 2, further comprising:
   (d) using a mask applied to the master basis dictionary to identify the subsets.

10. The method of claim 1, wherein:
    step (a) comprises using two-dimensional data for the multi-dimensional data; and
    step (c) comprises using two-dimensional dictionaries as the non-identical dictionaries of basis functions.

11. The method of claim 10, wherein step (a) comprises using a digital image as the two-dimensional data.

12. The method of claim 1, wherein:
    step (a) comprises using three-dimensional data as the multi-dimensional data; and
    step (c) comprises using three-dimensional dictionaries as the non-identical dictionaries of basis functions.

13. The method of claim 12, wherein step (a) comprises using data having two spatial dimensions and one temporal dimension as the multi-dimensional data.

14. The method of claim 12, wherein step (a) comprises using three-dimensional data having three spatial dimensions.

15. The method of claim 1, wherein:
    step (a) comprises using three-dimensional data as the multi-dimensional data; and
    step (c) comprises using dictionaries having more than three dimensions as the non-identical dictionaries of basis functions.

16. The method of claim 15, wherein step (a) comprises using data having at least one temporal dimension as the multi-dimensional data.

17. The method of claim 1, further comprising:
    wherein step (c) further comprises performing a matching pursuits process on the multi-dimensional data; and
    (d) applying a transform to at least one dimension of the multi-dimensional data prior to step (c).

18. The method of claim 17, wherein step (a) comprises using a wavelet transform as the transform.

19. The method of claim 18, wherein step (c) comprises using transform coefficient groupings that comprise subbands of the wavelet transform.

20. The method of claim 18, wherein step (a) comprises using a multi-dimensional wavelet transform as the wavelet transform.

21. The method of claim 20, wherein step (a) comprises using a discrete cosine transform as the multi-dimensional wavelet transform.

22. The method of claim 20, wherein the non-identical dictionaries of basis functions in step (c) further comprise a transpose of basis functions applied to at least one other transform coefficient grouping.

23. The method of claim 1, further comprising:
    (d) using audio data as the multi-dimensional data.

24. The method of claim 1, further comprising:
    (d) using video data as the multi-dimensional data.

25. A method for decoding multi-dimensional data using a codebook of basis functions, comprising:
    (a) decoding different groupings of transform coefficients with non-identical dictionaries of basis functions having more than three dimensions from the codebook to create decoded multi-dimensional data having more than three dimensions; and
    (b) applying a transform to the decoded multi-dimensional data.

26. The method of claim 25, wherein step (a) comprises using subsets of a master basis dictionary in the non-identical dictionaries of basis functions.

27. The method of claim 26, further comprising:
    (c) communicating the subsets of the master basis dictionary in a form of a sampled value of a function with a coder.

28. The method of claim 26, further comprising:
(c) communicating the subsets of the master basis dictionary with a coder.

29. The method of claim 26, further comprising:
(c) communicating data indicative of the subsets of the master basis dictionary with a coder.

30. The method of claim 26, further comprising:
(c) applying a mask to the master basis dictionary to identify the subsets of the master basis dictionary.

31. The method of claim 25, wherein step (a) comprises using two-dimensional data as the multi-dimensional data and two-dimensional dictionaries as the non-identical dictionaries of basis functions.

32. The method of claim 31, wherein step (a) comprises using two-dimensional data that comprises a digital image as the multi-dimensional data.

33. The method of claim 25, wherein step (a) comprises using three-dimensional data as the multi-dimensional data and three-dimensional dictionaries as the non-identical dictionaries of basis functions.

34. The method a claim 33, wherein step (a) comprises using data having two spatial dimensions and one temporal dimension as the multi-dimensional data.

35. The method of claim 25, wherein step (a) comprises using data having three spatial dimensions as the multi-dimensional data.

36. The method of claim 25, wherein step (a) comprises using data having at least one temporal dimension as the multi-dimensional data.

37. The method of claim 25, wherein step (a) comprises using data having a total number of dimensions that is higher than a total number of dimensions of the codebook as the multi-dimensional data; and the decoding further comprises applying a matching pursuits process to the multi-dimensional data.

38. The method of claim 25, wherein step (b) comprises using an inverse wavelet transform as the transform.

39. The method of claim 38, wherein step (b) comprises using an inverse discrete cosine transform as the transform.

40. The method of claim 25, further comprising:
(c) using audio data as the multi-dimensional data.

41. The method of claim 25, further comprising:
(c) using video data as the multi-dimensional data.

42. A computer-readable medium containing instructions that, when executed by a processor, causes the processor to:
(a) apply a transform to multi-dimensional data to create transform coefficients, wherein the multi-dimensional data has a total number of dimensions higher than a total number of dimensions of a codebook of basis functions;
(b) form groups of transform coefficients; and
(c) code different ones of the groups of transform coefficients using matching pursuits coding with non-identical dictionaries of basis functions from the codebook of basis functions.

43. The computer-readable medium of claim 42, wherein the method further causes the processor to use subsets of a master basis dictionary in the non-identical dictionaries of basis functions.

44. The computer-readable medium of claim 43, wherein the method further causes the processor to use overlapping subsets of the master basis dictionary in the non-identical dictionaries of basis functions.

45. The computer-readable medium of claim 42, wherein the method further causes the processor to:
(d) communicate the subsets with a decoder.

46. The computer-readable medium of claim 42, wherein the method further causes the processor to:
(d) communicate the subsets in a form of a sampled value of a function with a decoder.

47. The computer-readable medium of claim 42, wherein the method further causes the processor to:
(d) communicate data indicative of the subsets with a decoder.

48. The computer-readable medium of claim 42, wherein the method further causes the processor to:
(d) use audio data as the multi-dimensional data.

49. The computer-readable medium of claim 42, wherein the method further causes the processor to:
(d) use video data as the multi-dimensional data.

50. A computer-readable medium containing instructions that, when executed by a processor, causes the processor to:
(a) decode different groupings of transform coefficients with non-identical dictionaries of basis functions having more than three dimensions from a codebook to create decoded multi-dimensional data having more than three dimensions; and
(b) apply a transform to the decoded multi-dimensional data.

51. The computer-readable medium of claim 50, wherein the method further causes the processor to use subsets of a master basis dictionary in the non-identical dictionaries of basis functions.

52. The computer-readable medium of claim 51, wherein the method further causes the processor to use overlapping subsets of the master basis dictionary in the non-identical dictionaries of basis functions.

53. The computer-readable medium of claim 50, wherein the method further causes the processor to:
(c) communicate the subsets of the master basis dictionary with a coder.

54. The computer-readable medium of claim 50, wherein the method further causes the processor to:
(c) communicate the subsets of the master basis dictionary in a form of a sampled value of a function with a coder.

55. The computer-readable medium of claim 50, wherein the method further causes the processor to:
(c) use audio data as the multi-dimensional data.

56. The computer-readable medium of claim 50, wherein the method further causes the processor to:
(c) use video data as the multi-dimensional data.

57. An apparatus, comprising:
a coder configured to encode multi-dimensional data using a codebook of basis functions, wherein the multi-dimensional data has a total number of dimensions higher than a total number of dimensions of the codebook of basis functions;
wherein said coder is configured to apply a transform to the multi-dimensional data to create transform coefficients, form groups of transform coefficients, and code different ones of the groups of transform coefficients using matching pursuits coding with non-identical dictionaries of basis functions from the codebook of basis functions.

58. The apparatus of claim 57, wherein the coder is further configured to code the different ones of the groups of transform coefficients using subsets of a master basis dictionary in the non-identical dictionaries of basis functions.

59. The apparatus of claim 58, wherein the coder is further configured to code the different ones of the groups of transform coefficients using overlapping subsets of the master basis dictionary in the non-identical dictionaries of basis functions.

60. The apparatus of claim 58, wherein the coder is further configured to communicate the subsets with a decoder.

61. The apparatus of claim 58, wherein the coder is further configured to communicate the subsets with a decoder in a form of a sampled value of a function.

62. The apparatus of claim 58, wherein the coder is further configured to communicate data indicative of the subsets with a decoder.

63. The apparatus of claim 57, wherein the multi-dimensional data comprises audio data.

64. The apparatus of claim 57, wherein the multi-dimensional data comprises video data.

65. An apparatus, comprising:
a decoder configured to decode multi-dimensional data using a codebook of basis functions;
wherein said decoder decodes different groupings of transform coefficients with non-identical dictionaries of basis functions having more than three dimensions from the codebook to create decoded multi-dimensional data having more than three dimensions and applies a transform to the decoded multi-dimensional data.

66. The apparatus of claim 65, wherein the decoder is further configured to decode the different ones of the groups of transform coefficients using subsets of a master basis dictionary in the non-identical dictionaries of basis functions.

67. The apparatus of claim 66, wherein the decoder is further configured to decode the different ones of the groups of transform coefficients using overlapping subsets of the master basis dictionary in the non-identical dictionaries of basis functions.

68. The apparatus of claim 66, wherein the decoder is further configured to communicate the subsets of the master basis dictionary with a coder.

69. The apparatus of claim 66, wherein the decoder is further configured to communicate the subsets of the master basis dictionary in a form of a sampled value of a function with a coder.

70. The apparatus of claim 65, wherein the multi-dimensional data comprises audio data.

71. The apparatus of claim 65, wherein the multi-dimensional data comprises video data.

* * * * *